US012412733B2

(12) United States Patent
Proudfoot et al.

(10) Patent No.: US 12,412,733 B2
(45) Date of Patent: Sep. 9, 2025

(54) ELECTRODE ARRAY

(71) Applicant: Oxford Instruments Nanotechnology Tools Limited, Abingdon (GB)

(72) Inventors: Gary Proudfoot, Ardington (GB); Gareth Waters, Bassaleg (GB); Annika Peter, Abingdon (GB); Mike Cooke, Bristol (GB); Aileen O'Mahony, Abingdon (GB)

(*) Notice: Subject to any disclaimer, the term of this patent is extended or adjusted under 35 U.S.C. 154(b) by 1196 days.

(21) Appl. No.: 17/282,241

(22) PCT Filed: Oct. 1, 2019

(86) PCT No.: PCT/GB2019/052763
§ 371 (c)(1),
(2) Date: Apr. 1, 2021

(87) PCT Pub. No.: WO2020/070482
PCT Pub. Date: Apr. 9, 2020

(65) Prior Publication Data
US 2021/0358723 A1  Nov. 18, 2021

(30) Foreign Application Priority Data
Oct. 2, 2018 (GB) ...................... 1816059

(51) Int. Cl.
*H01L 21/00* (2006.01)
*C23C 16/00* (2006.01)
*H01J 37/32* (2006.01)

(52) U.S. Cl.
CPC .. *H01J 37/32568* (2013.01); *H01J 37/32082* (2013.01); *H01J 37/3244* (2013.01);
(Continued)

(58) Field of Classification Search
None
See application file for complete search history.

(56) References Cited

U.S. PATENT DOCUMENTS 4,767,641 A * 8/1988 Kieser ............... B29C 59/14
156/345.43
6,764,658 B2 * 7/2004 Denes ............... H01J 37/3244
156/345.33
(Continued)

FOREIGN PATENT DOCUMENTS

CN 103250470 8/2013
EP 2960358 A1 12/2015
(Continued)

OTHER PUBLICATIONS

International Search Report from related PCT Application No. PCT/GB2019/052763, dated Jan. 7, 2020, 3 pages.
(Continued)

*Primary Examiner* — Parviz Hassanzadeh
*Assistant Examiner* — Michelle Crowell
(74) *Attorney, Agent, or Firm* — Brooks, Cameron & Huebsch, PLLC

(57) ABSTRACT

A plasma generation electrode array for a plasma processing tool is described. The plasma processing tool comprises a processing chamber and a substrate table therein for supporting a substrate in use on which material is to be deposited and/or etched. The electrode array comprises a plurality of ground electrodes and at least one live electrode, the plurality of ground electrodes not being in electrical contact with the at least one live electrode, and arranged such the ground electrodes and live electrode(s) alternate with one another along a first direction in a first plane which is substantially parallel to the substrate table in use. The ground and live electrodes are spaced from one another along the first direction, wherein each of the ground and live electrodes extends from a base thereof to a distal end thereof in a second direction which is substantially perpendicular to the first plane. The ground electrodes and the at least one live electrode are arranged such that the distal ends of the ground
(Continued)

electrodes are positioned further along the second direction than the distal end(s) of the at least one live electrode(s) such that, in use, the distal ends of the ground electrodes are closer, in the second direction, to the substrate table than are the distal end(s) of the at least one live electrode(s).

17 Claims, 5 Drawing Sheets

(52) U.S. Cl.
CPC ... *H01J 37/32577* (2013.01); *H01J 2237/332* (2013.01); *H01J 2237/334* (2013.01)

(56) References Cited

U.S. PATENT DOCUMENTS

| | | | | |
|---|---|---|---|---|
| 8,636,871 | B2* | 1/2014 | Sawada | H01J 37/32091 156/345.43 |
| 8,883,027 | B2* | 11/2014 | Yoon | H01L 21/67069 156/345.43 |
| 2005/0241765 | A1* | 11/2005 | Dhindsa | H01J 37/3244 156/345.37 |
| 2009/0102385 | A1* | 4/2009 | Wi | H01J 37/32091 315/111.21 |
| 2011/0005681 | A1 | 1/2011 | Savas et al. | |
| 2011/0226728 | A1* | 9/2011 | Blom | H05H 1/2475 216/13 |
| 2012/0305191 | A1* | 12/2012 | Mun | H01J 37/32091 156/345.44 |
| 2013/0206720 | A1* | 8/2013 | Blom | H05H 1/24 156/345.43 |
| 2013/0255575 | A1 | 10/2013 | Chang et al. | |
| 2013/0309416 | A1* | 11/2013 | Yokoyama | C23C 16/45595 118/723 E |
| 2013/0337657 | A1 | 12/2013 | Savas et al. | |
| 2014/0007812 | A1 | 1/2014 | Chang et al. | |
| 2015/0129112 | A1* | 5/2015 | Saito | H01J 37/32522 156/89.12 |
| 2015/0235812 | A1* | 8/2015 | Han | C23C 16/45551 118/723 R |
| 2018/0202046 | A1 | 7/2018 | Savas et al. | |

FOREIGN PATENT DOCUMENTS

| | | |
|---|---|---|
| JP | A-H05-129094 | 5/1993 |
| JP | A-H09-213684 | 8/1997 |
| KR | 20090040818 | 4/2009 |

OTHER PUBLICATIONS

Combined Search and Examination Report under Sections 17 and 18(3) from related GB Application No. GB1816059.8, dated Mar. 27, 2019, 7 pages.
Corrected Search Report from related GB Application No. GB1816059.8, dated May 9, 2019, 2 pages.
Notification of Reasons for Rejection from related Japan Patent Application No. 2021-518480, dated May 26, 2023, 11 pages.
Office Action from related China Patent Application No. 201980072545.4, dated Sep. 1, 2023, 9 pages.

* cited by examiner

ELECTRODE ARRAY

FIELD OF THE INVENTION

The invention relates to an electrode array, in particular an electrode array for generating plasma in a plasma processing tool.

BACKGROUND TO THE INVENTION

Surface processing techniques, such as material deposition or etching on the surface of a substrate, can be performed using plasma processing tools.

A plasma processing tool typically includes a chamber configured to receive gases from a number of gas supplies, for example a precursor gas for use in a plasma-enhanced deposition process, etching gases for use in plasma etching processes, gases for plasma generation and purge gases for clearing plasma-excited gases from the chamber. A plasma source is provided for converting one or more of the gases into a plasma. The substrate that is to be processed is placed on a substrate table inside the chamber and is exposed to the plasma source.

Both ionised species and neutral radicals are typically generated in a plasma source. This leads to a flux of ions and radicals towards the substrate. In some plasma processes, for example plasma-enhanced atomic layer deposition, ionised species colliding with the substrate may damage the deposited layer and/or the surface of the substrate, while neutral radicals can contribute to the deposition process by, for example, reacting with adsorbed species (deposited by, for example, a precursor gas) on the surface of the substrate. Furthermore, while many etching processes employ ion bombardment to remove material from a substrate, some can be performed using radicals alone. The ability to reduce the flux of ions colliding with a substrate in surface processing techniques is therefore desirable. It is also desirable that the flux of radicals and ions across the surface of the substrate is as homogenous as possible in order to achieve a uniform degree of processing across the extent of the substrate.

Among the plasma sources that are conventionally used in plasma processing tools are induction coupled plasmas (ICPs). In a plasma processing tool using an ICP, an AC current is passed through a coil surrounding the chamber. The AC current gives rise to a time-varying magnetic field through the coil, which in turn induces currents in a gas inside the chamber that lead to the generation of the plasma. Using an ICP of this sort, a relatively homogenous flux of radicals can be delivered across the surface of the substrate since plasma is generated throughout the chamber. However, ions will also be generated throughout the chamber and it is sometimes desirable to shield the substrate from these without also reducing the flux of radicals.

As an alternative to ICPs in which the coil surrounds the chamber, so-called tubular or "remote" ICPs include a coil formed around a narrow tube that extends towards an opening in a wall of the chamber facing the substrate. An AC current is passed through the coil in order to give rise to a plasma-generating current in the gas inside the tube, and the plasma escapes through the opening towards the substrate. This and similar sources where typically the plasma is formed in a narrow tube feeding the chamber can reduce ions effectively while delivering some radicals. Ions generated inside the tube have a comparatively high chance of colliding with a wall of the tube and being stopped before they reach the substrate, whereas radicals are more likely to survive collisions with the wall and hence reach the substrate. A disadvantage of tubular ICPs, however, is that the plasma source is necessarily relatively narrow requires further measures to provide a homogenous flux of radicals across the surface of the substrate.

Capacitively coupled plasmas (CCPs) are an alternative plasma source to ICPs. CCPs typically include a pair or an array of electrodes, whereby a voltage applied between adjacent electrodes causes the breakdown of a gas into a plasma. U.S. Pat. No. 8,636,871 gives some examples of plasma sources including electrodes for plasma generation. The electrode array in a CCP can be constructed so as to extend over any chosen area (by simply including an appropriate number of electrodes in the desired area), so can provide a homogenous flux of ions and radicals across the substrate. In a plasma tool using a CCP, a current can arise between electrodes and the substrate table. This is a result of the voltage that inevitably arises between the substrate table and the electrodes when the electrodes are powered for plasma generation, and can cause ions to be generated near the substrate and damage its surface and the deposited layer.

In view of the detrimental effects of ion bombardment in certain surface processing techniques, there is a need for a plasma source that provides a high flux of radicals and a minimal flux of ions to the surface of a substrate while achieving uniform processing across the substrate.

SUMMARY OF THE INVENTION

A first aspect of the invention provides a plasma generation electrode array for a plasma processing tool, the plasma processing tool comprising a processing chamber and a substrate table therein for supporting a substrate in use on which material is to be deposited and/or etched, the electrode array comprising a plurality of ground electrodes and at least one live electrode, the plurality of ground electrodes not being in electrical contact with the at least one live electrode, and arranged such the ground electrodes and live electrode(s) alternate with one another along a first direction in a first plane which is substantially parallel to the substrate table in use, the ground and live electrodes being spaced from one another along the first direction, wherein each of the ground and live electrodes extends from a base thereof to a distal end thereof in a second direction which is substantially perpendicular to the first plane, the ground electrodes and the at least one live electrode being arranged such that the distal ends of the ground electrodes are positioned further along the second direction than the distal end(s) of the at least one live electrode(s) such that, in use, the distal ends of the ground electrodes are closer, in the second direction, to the substrate table than are the distal end(s) of the at least one live electrode(s).

The term "ground electrodes" here refers to electrodes that will be electrically grounded in use, and the term "live electrodes" refers to electrodes to which a voltage with respect to ground will be applied in use, for example by connecting the live electrodes to an electrical power source such as a radio frequency (RF) power source. The substrate table may also be grounded, or could be connected to its own electrical power source. The ground and live electrodes are arranged alternately, so a voltage will arise between neighbouring electrodes that can cause the generation of a plasma from a gas that is located in the spaces between the electrodes. The first plane here is any notional plane that is intersected by each of the ground electrodes and the live electrode(s) and is, in use, substantially parallel to the substrate table.

The distal ends of the ground electrodes are further from the first plane (whichever notional first plane is selected) in the second direction than are those of the live electrode(s) with the result that, in use, the distal ends of the ground electrodes will be closer to the substrate table than the distal ends of the live electrodes will be. This can be achieved in a number of ways, such as by the ground electrodes being longer than the live electrode(s) (and optionally having the bases of the ground and live electrodes arranged to be coplanar in the direction that is in use parallel to the substrate table), or by the ground and live electrodes having the same or similar lengths and being arranged such that the bases of the ground electrodes are closer, in use, to the substrate table along the direction perpendicular to the substrate table than those of the live electrodes. In this latter arrangement, the ground electrodes could even be shorter than the live electrode(s) provided their distal ends are still positioned further along the second direction than those of the live electrode(s).

Since the distal ends of the ground electrodes are closer, in use, to the substrate table along the second direction than are the distal ends of the live electrode(s), electric field lines that begin at the live electrode(s) (as a result of the live electrodes being powered in use) will have an increased tendency to terminate at the ground electrodes, as opposed to at the substrate table, in comparison to arrangements in which the distal ends of the live and ground electrodes are equally close to the substrate table. This leads to a comparatively lower current arising between the live electrode(s) and the substrate table in comparison to arrangements in which the distal ends of the live and ground electrodes are equally close to the substrate table, thereby reducing the number of ions that are generated near the substrate. Furthermore, ions generated in the vicinity of the electrodes are more likely to collide with an electrode as they travel along the electric field associated with a live electrode (since a greater fraction of the electric field leads from the live to the ground electrodes), and this reduces the flux of ions generated between the electrodes reaching the substrate.

The disclosed plasma generation electrode array can also provide a significant improvement to the speed of processing a substrate, relative to conventional plasma sources such as remote/tubular ICPs. This is due to a higher flux of radical reaching the substrate, as a result of (1) the plasma being able to be generated nearer to the substrate surface, as compared with in a remote tube (the disclosed electrode array can be positioned as close to the substrate as desired, within the preferred limits described below); and (2) spreading the generation of plasma across the full area of the substrate avoids the need for additional hardware or additional chamber volume to disperse the radicals. These factors have the effect that the presently disclosed arrangement can deliver a certain dose of radicals which achieves a desired effect on the substrate in a shorter period of time than a conventional remote ICP could deliver the same dose.

In preferred embodiments, the distal end of each ground electrode (i) is positioned further along the second direction than the distal end of an adjacent live electrode (j) by a distance $A_{ij}$; and each ground electrode (i) is separated from the adjacent live electrode (j) along the first direction by a distance $B_{ij}$; wherein $A_{ij}$ is greater than or equal to $B_{ij}/3$ (i.e. a third of distance $B_{ij}$), preferably $A_{ij}$ is greater than or equal to $B_{ij}/2$ (i.e. half of distance $B_{ij}$). An adjacent live electrode here means a live electrode that is immediately next to the ground electrode in the alternating sequence of electrodes, i.e. with no other electrodes between the ground and live electrodes in question. This feature defines a preferred aspect ratio between the extent by which the distal end of a particular ground electrode is closer to the substrate table (along the direction perpendicular to the substrate table) than that of a neighbouring live electrode and the separation (along the direction perpendicular to the substrate table) of the ground electrode from the neighbouring live electrode. The actual values of the dimensions $A_{ij}$ and $B_{ij}$ may or may not be the same for different pairs of neighbouring ground and live electrodes; what is relevant is the ratio between them. It has been found that the effect of reducing the discharge current between the live electrodes and the substrate table is particularly pronounced when $A_{ij}$, i.e. the distance by which the distal end of a particular ground electrode extends further towards the substrate table (along the direction perpendicular to the substrate table) than a neighbouring live electrode, is at least one third of the separation, $B_{ij}$, along the direction parallel to the substrate table between the particular ground electrode and the neighbouring live electrode. The effect is further pronounced when the distance $A_{ij}$ is at least half of $B_{ij}$.

However, it is also the case that a difference in total area between live and ground electrodes in an RF plasma source generates a DC offset potential which can cause undesirable sputter etching of the live electrode(s). For this reason, it is preferred that the distal ends of the ground electrodes do not extend beyond those of the live electrode(s) by too great a distance, and hence in particularly preferred embodiments the distance $A_{ij}$ (between the distal end of each ground electrode (i) and the distal end of an adjacent live electrode (j) along the second direction) is less than the distance $B_{ij}$ (by which the ground electrode (i) is separated from the adjacent live electrode (j) along the first direction). This preferred upper limit of $A_{ij}$ being less than $B_{ij}$ can be combined with either of the preferred lower limits mentioned above, to define preferred ranges for the aspect ratio.

In particularly preferred embodiments, distance $B_{ij}$ is substantially the same for each pair of adjacent ground and live electrodes, and distance $A_{ij}$ is preferably also substantially the same for each pair of adjacent ground and live electrodes. In such embodiments, the separation along the first direction (which is parallel to the substrate table in use) between each ground electrode and its neighbouring live electrode(s) is substantially the same, and the distance by which the distal ends of the ground electrodes are closer to the substrate table along the second direction (which is perpendicular to the substrate table in use) than those of the live electrode(s) in use is also preferably substantially the same. Preferably this applies across the whole electrode array. This achieves a particularly uniform plasma. It is also possible to compensate for any remaining non-uniformity by adjusting the electrode sizes across the area.

In preferred embodiments, each ground electrode (i) is separated from an adjacent live electrode (j) along the first direction by a distance $B_{ij}$; and the distance along the second direction between the base and the respective distal end of each live electrode (j) is $C_j$; wherein $C_j$ is greater than or equal to $1.5 B_{ij}$, preferably also $C_j$ is less than or equal to $4 B_{ij}$. This constrains the ratio of the length, $C_j$, of a live electrode (between its base and distal end along the direction perpendicular to the substrate table) and its separation, $B_{ij}$, from a neighbouring ground electrode (along the direction parallel to the substrate table). The ion flux to a surface in a plasma is determined by the plasma density (electrons or ions per unit volume) adjacent to the surface. This preferred design provides that the most intense plasma runs in the lateral spaces between live and ground electrodes of the array. Neutral radicals, meanwhile, are not influenced by electric fields, and are created faster in regions where the plasma is more dense. The escape of radicals from the intense plasma to the substrate is constrained by the aspect ratio of the space where they are created. With a deeper, narrower space and a higher aspect ratio (i.e. $C_j \gg B_{ij}$), radicals are more likely to encounter a wall as they diffuse out of the plasma, and to be lost. With a shallower, wider, recess (i.e. (i.e. $C_j \leq B_{ij}$) radicals are more likely to escape. However, if the aspect ratio were too low, the RF current loses its confinement. The preferred ratios given above therefore ensure that $B_{ij}$ is sufficiently large in relation to $C_j$ so as to allow a substantial flux of radicals to escape the space between the live and ground electrodes, but not be so comparatively large that the live electrode is so exposed that an undesirably high current arises between the live electrode and the substrate table. Furthermore, the motion of ions will be influenced by the electric field between the electrodes in the plasma source, whereas neutral radicals will be unaffected. Ions that are impelled by the electric field towards an electrode have a chance of colliding with, and being stopped by, the electrode, so narrowing the spacing $B_{ij}$ in relation to $C_j$ can reduce the flux of ions escaping and reaching the substrate.

Preferably the width along the first direction of each of the at least one live electrode is less than 1.1 times the separation along the first direction between said live electrode and a respective adjacent ground electrode. If a live electrode is excessively wide, the neighbouring ground electrodes will be less able to effectively prevent discharge currents from across the entire width of the live electrode from reaching the substrate table. The live electrode(s) being narrower than the distance along the first direction to the neighbouring ground electrodes improves the effectiveness of the ground electrodes at preventing a current arising between the live electrode(s) and the substrate table in use.

In preferred embodiments the length of each ground electrode from the base thereof to the distal end thereof is greater than the length of the, or each, live electrode from the base thereof to the distal end thereof. At noted above, this is not essential. However, this allows the ground and live electrodes to be arranged such that their bases are approximately coplanar in the notional first plane, which simplifies the construction of the electrode array.

Preferably the electrode array comprises a plurality of live electrodes. This allows the electrode array to be constructed with alternately arranged live and ground electrodes over any chosen area, thereby allowing a more homogenous plasma to be generated across that area (and in turn ensuring a more uniform flux of radicals over the surface of the substrate).

In embodiments comprising a plurality of live electrodes, preferably at least two of, particularly preferably all of, the live electrodes are arranged such that the bases thereof are substantially coplanar in a second plane, the second plane being substantially parallel to the first plane. This increases the uniformity of the electrode array and hence encourages the formation of a homogenous plasma across the electrode array in use.

Preferably the ground electrodes are arranged such that the bases thereof are substantially coplanar in a third plane, the third plane being substantially parallel to the first plane. This also increases the uniformity of the electrode array and hence encourages the formation of a homogenous plasma across the electrode array in use. The second and third planes will be spaced from one another in the second direction in many embodiments, although this may only be by a small amount sufficient to achieve electrical isolation between the ground and live electrodes.

The electrodes could take any lateral arrangement suitable for the geometry of the processing tool. For instance the ground and live electrodes could be configured as respective interdigitating combs. However, in preferred embodiments the cross-section of each of the ground electrodes and/or the at least one live electrode in the first plane is a closed loop, preferably annular (although other shapes of loop such as square, rectangular or elliptical could be used). In particularly preferred embodiments the ground electrodes and the at least one live electrode are arranged concentrically in the first plane. This increases the uniformity of the electrode array and hence encourages the formation of a homogenous plasma across the electrode array in use. Preferably, one of the ground or live electrodes is located at the centre of the array. This electrode may be a "point" electrode rather than configured as a loop.

In preferred embodiments the electrode array further comprises a panel adapted, in use, to form all or part of a wall of a processing chamber in a plasma processing tool, the panel having a first side on which the ground electrodes and the at least one live electrode are supported, the ground electrodes being in electrical contact with the panel and the at least one live electrode being out of electrical contact with the panel; wherein a bore extends from the first side of the panel to a second side of the panel whereby the at least one live electrode may be accessed from the second side of the panel. In preferred examples, more than one such more (and corresponding feedthroughs, discussed below) may be provided.

The panel can, in use, form all or part of a wall of a processing chamber in a plasma processing tool (for example forming a lid of the chamber) such that the first side, which supports the ground and live electrodes, is on the inside of the chamber. The panel may be adapted to allow, in use, the conditions required for plasma processing, for example a (partial) vacuum, to be supported inside the chamber. The bore extending through the panel allows access to the live electrode(s), meaning that the live electrodes can be connected to, for example, a power source such as an RF power source situated outside the chamber. The ground electrodes are in electrical contact with the panel so, in use, the ground electrodes will be electrically grounded if the panel is itself electrically grounded.

In particularly preferred embodiments a feedthrough is provided which extends through the bore, the feedthrough being out of electrical contact with the panel and in electrical contact with the at least one live electrode. The feedthrough can, in use, electrically connect the live electrode(s) to a power source outside the chamber; and since it is out of electrical contact with the panel, which is grounded, the ground electrodes will, in use, remain out of electrical contact with such a power source.

As noted above, more than one such feedthrough may be provided, each feedthrough located in a corresponding bore through the panel. Each feedthrough and bore combination may have any of the preferred features discussed below. Additional feedthroughs provide more secure mechanical support, additional cross sectional area for heat transfer, and create options to vary the power feed to different portions of the electrode array.

The feedthrough preferably comprises a first end in contact with the at least one live electrode at the first side of the panel; and an electrically conductive shaft extending through the bore from the first end to a second end on the second side of the panel. The feedthrough can, if desired, be formed integrally with the one or more live electrodes.

In particularly preferred embodiments the second end of the feedthrough comprises a flanged portion having a greater width than the bore where the bore opens on the second side of the panel; and a first electrically insulating element is positioned between the flanged portion of the second end of the feedthrough and a portion of the surface of the second side of the panel; wherein the first electrically insulating element preferably comprises a dielectric material. The insulating element physically and electrically separates the flanged portion of the feedthrough from the panel, thereby ensuring that the feedthrough and the panel do not come into contact (which in turn ensures that the panel, and hence the ground electrodes, do not come into electrical contact with a power source that is connected in use to the live electrodes). Any electrically insulating material can be used for this purpose but dielectric materials such as PTFE (polytetrafluoroethylene), PEEK (polyether ether ketone) or ceramics such as alumina are preferred.

Preferably the first electrically insulating element substantially surrounds a portion of the shaft of the feedthrough between the flanged portion of the second end and the surface of the second side of the panel. This means that the first electrically insulating element surrounds the entire (or almost the entire) circumference of a portion of the feedthrough between the flanged portion of the feedthrough and the surface of the panel. This allows the first electrically insulating element to seal the bore, thereby preventing air from outside the chamber entering through the bore when the panel is in use forming a wall of the chamber, for example. The seal may be improved by mounting one or more sealing elements, such as resilient O-rings, on the upper and/or lower surfaces of the first electrically insulating element.

The electrode array may further comprise a second electrically insulating element substantially surrounding a portion of the feedthrough inside the bore, wherein the second electrically insulating element preferably comprises a dielectric material. The second electrically insulating element prevents plasma travelling into a portion of the space between the feedthrough and the inner surface of the bore. This is advantageous as, when the electrode array is in use, the generated plasma can enter such spaces and cause conductive material to be deposited on the surrounding surfaces. If a conductive layer were to form joining the feedthrough to the inner surface of the bore, the ground and live electrodes might come into electrical contact and this would impede the ability of the electrode array to generate a plasma. By preventing plasma from entering this space, the likelihood of such a conductive layer forming is reduced. In particularly preferred embodiments the first electrically insulating element and the second electrically insulating element are integrally formed with one another. This simplifies the construction of the electrode array. Advantageously, the second electrically insulating element is sized to fill at least half of the space between the feedthrough and the walls of the bore through the panel. The second electrically insulating element can also help to locate the feedthrough centrally in position within the bore.

Preferably an outer surface of the feedthrough is separated from an inner surface of the bore by a distance E in the first direction; and the bore extends a distance D along the second direction; wherein D is greater than or equal to 10E, preferably D is greater than or equal to 50E. The distance E corresponds to the width, in the first direction, of the space between the feedthrough inside the bore and the inner surface of the bore, and D is the extent of the bore along the second direction. These constraints ensure that the width E is sufficiently narrow in relation to the extent of the bore D to significantly reduce the amount of plasma that travels along the extent of the bore when in use, thereby reducing the likelihood of a conductive layer building up inside the bore. The gap E suppresses plasma, and provides multiple wall encounters for radicals, such that minimal deposition occurs on the dielectric isolation surface. In particularly preferred embodiments the distance E is in the range 0.5 millimetres (mm) to 2.5 mm. The feedthrough is in electrical contact with the live electrode(s) while inner surface of the bore is in electrical contact with the ground electrodes. It is a property of plasma that a minimum separation is required between live and ground electrodes to sustain a glow. The distance E determines whether or not a plasma will strike at a given gas pressure. Gaps in this range will suppress plasma in the narrow coaxial space within the bore at pressures lower than about 5 Torr (although the plasma will run elsewhere at such pressures). The external dimension of the feedthrough is preferably sufficiently small that thermal expansion of the feedthrough body will not compromise the gap E between the feedthrough and the panel during use.

It should be noted that multiple such bores and respective feedthroughs can be provided through the panel if desired.

In preferred embodiments the ground electrodes are integrally connected to the panel. Since the ground electrodes and the panel are both, in use, electrically grounded, this simplifies the construction of the electrode array while achieving the desired electrical configuration. In particularly preferred embodiments, the electrode array further comprises a first heating element configured to heat the panel so as to cause the ground electrodes to be heated. Heating the ground electrodes can reduce the rate at which material is deposited on the ground electrodes in use, thereby reducing the frequency with which maintenance and cleaning of the electrode array are required. The electrode array may also comprise at least one second heating element adapted to heat the at least one live electrode. This similarly can reduce the rate at which material is deposited on the live electrode(s) in use and prevents the need for frequent cleaning of the assembly. Preferably each second heating element comprises a resistive element disposed inside a respective live electrode. The resistive element can, in use, be electrically powered so as to generate heat inside the live electrode(s), thereby allowing the live electrode(s) to be uniformly heated while avoiding the need to employ more complicated means of heating (such as a heating fluid).

In preferred embodiments the electrode array comprises a conduit adapted to deliver, in use, a gas to at least one interstice between a ground electrode and a live electrode, wherein the gas preferably comprises one of a purge gas and a gas for plasma generation. Being able to deliver, in use, a gas for plasma generation directly to the spaces between the live and ground electrodes ensures that there is an adequate supply of this gas as a substrate is being processed. Being able to deliver a purge gas to these spaces allows the supply of plasma to be quickly terminated, which can, for example, increase the speed and efficiency with which cyclic plasma processes can be performed. Preferably the conduit comprises a channel formed through at least one of the ground and/or live electrodes.

In accordance with a second aspect of the invention there is provided a plasma generation apparatus comprising: a plasma generation electrode array according to the first aspect of the invention; and an electrical power source connected to the at least one live electrode. In preferred embodiments the power source is an RF power source. The plasma generation apparatus may also comprise a controller configured to control the RF power source to apply a power signal to the live electrode(s) for generation of a plasma.

In accordance with a third aspect of the invention there is provided a plasma processing tool comprising: a processing chamber; a substrate table situated inside the processing chamber; a plasma generating apparatus according to the second aspect of the invention, the plasma generating electrode array of the plasma generating apparatus being situated such that at least the ground and live electrodes thereof are inside the processing chamber, and being positioned such that the distal ends of the ground electrodes are closer, in the second direction, to the substrate table than are the distal ends of the at least one live electrodes; and at least one gas supply configured to deliver, in use, a gas for plasma generation to the processing chamber.

In the second and third aspects of the invention, the plasma generation electrode array can have any of the preferred features discussed above with respect to the first aspect of the invention.

The plasma processing tool preferably further comprises an RF voltage source electrically connected to the sample table. This allows the electric field near the surface to be manipulated in use, thereby allowing the energy distribution of ions proximate to the substrate to be controlled. This can, for example, tailor the property of the deposited layer on the surface of a substrate on the substrate table by ion bombardment. For instance, a single frequency (e.g. 13.56 MHz) bias could be applied to the table, or a combination of this with other frequencies. Suitable RF waveforms tailored for purposes such as altering the distribution of ion bombardment energy are also well known. Alternatively and/or in addition, the RF voltage source can be used to generate and accelerate ions from the plasma to the substrate surface if this is required in certain steps of a process. Despite the design of the electrode being configured to minimise ion flux to the substrate as discussed above, this can be selectively overcome and ions drawn to the substrate from the plasma source using an additional power source applied to the substrate table in this way. This option can be used in etching processes and/or in deposition processes (such as in combination with atomic layer deposition) to modify the film properties. For instance, atomic layer etching can be achieved in a cyclical process using ion bombardment for just a portion of the cycle.

In preferred embodiments the distance along the second direction between the distal end of each ground electrode and the substrate table is greater than the separation $B_{ij}$ along the first direction between each ground electrode and a respective adjacent live electrode. This further reduces the likelihood of a discharge current arising between the live electrodes and the substrate table.

BRIEF DESCRIPTION OF THE DRAWINGS

Examples of plasma generation electrode arrays, apparatus and plasma processing tools in accordance with aspects of the invention will now be described with reference to the accompanying drawings, in which.

DETAILED DESCRIPTION

Figure 1:
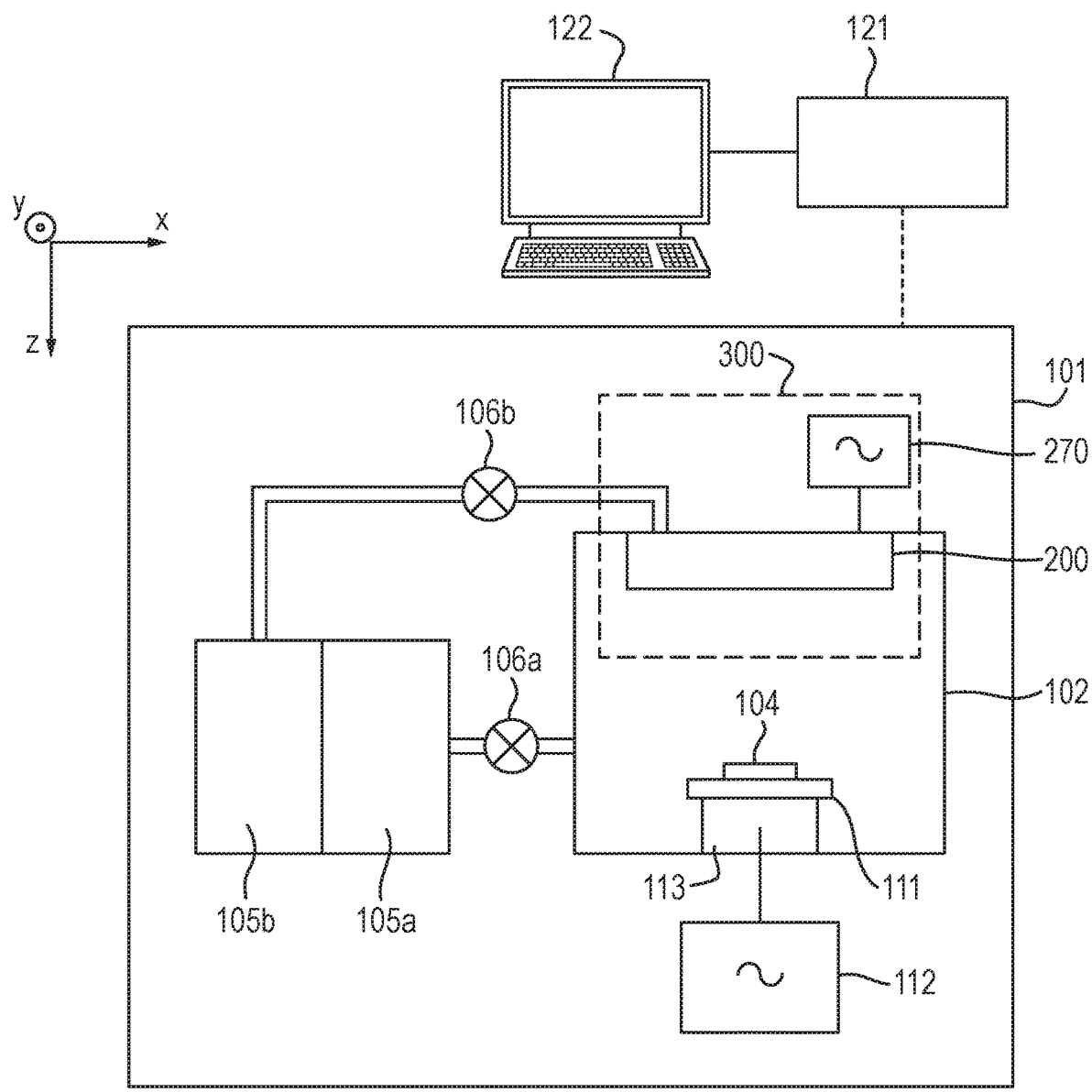
FIG. 1 schematically shows an exemplary plasma processing tool suitable for use with a plasma generation apparatus in accordance with embodiments of the present invention.

FIG. 1 schematically shows an exemplary plasma processing tool 101 that is suitable for use with a plasma generation apparatus 300 in accordance with embodiments of the present invention. The plasma processing tool 101 includes a processing chamber 102, which typically will contain a near vacuum, established by a vacuum pumping system (not shown). Inside the chamber 102 is a substrate table 111, on which a substrate 104 to be processed using the plasma processing tool 101 can be placed. Optionally, the substrate table 111 is electrically connected to a signal generator 112, which is configured to electrically bias the substrate table 111 with an RF waveform, as described further below. Alternatively, the table 111 may be grounded. The substrate table 111 may be supported by a lift 113, which can be controlled to raise or lower the substrate table 111 to a chosen height within the chamber 102. This may be used, for instance, to move the table 111 between a substrate loading position and a substrate processing position; the substrate processing position creating a smaller-volume inner chamber for rapid change of gas type in a cyclical process. The chamber 102 will also be provided with means to load and unload a substrate 104 onto the table 111 without breaking vacuum (not shown).

An electrode array 200 is supported above the substrate table 103 inside the chamber 102. The electrode array 200 may include a panel (not labelled, but described later with reference to FIGS. 3 and 4) that forms part or all of an upper wall of the plasma chamber 102. The electrode array 200 includes a series of alternately arranged ground electrodes (i.e. electrodes that are electrically grounded, not shown) and one or more live electrode(s) (not shown), which are electrically connected to an RF power source 270. The RF power source 270 is configured to electrically power the live electrodes so as to generate a voltage between the live and ground electrodes. In use, a gas for plasma generation can be fed to the electrode array 200, and the voltage between the live and ground electrodes breaks down the gas into a plasma. The electrode array 200 and the RF power source 270 are parts of the plasma generation apparatus 300. Preferred implementations of the electrode array 200 and the plasma generation apparatus 300 will be described in detail later with reference to FIGS. 2, 3 and 4.

The plasma processing tool 101 includes one or more gas sources such as those illustrated at 105a, 105b. The number and types of gas sources provided will depend on the nature of the plasma processing to be performed. For instance, if material is to be deposited (e.g. in atomic layer deposition processes), the gas source(s) will include one or more precursor gases for the chemical reaction in question. If the process involves etching material, the gas source(s) will include one or more etchant gases. Some processes such as the Bosch etching process involve both deposition and etching and so both types of gas will be available. Any of these reactant gases may be converted into a plasma by the apparatus 300. However in some cases additional gases may be provided specifically for plasma generation. Examples of suitable gases for plasma generation include noble gases (e.g. neon, Ne, and xenon, Xe), oxidising gases (e.g. oxygen, $O_2$, and nitrous oxide, $N_2O$), reducing gases (e.g. hydrogen, $H_2$) and nitrogen-bearing gases (e.g. molecular nitrogen, $N_2$, and ammonia, $NH_3$). One or more of the gas sources may also provide a purge gas, for limiting ingress of other gases and/or expelling a previous gaseous environment form the chamber 102. The purge gas could be, for example, a stable gas such as $N_2$ or Argon (Ar).

As a specific example, typical cyclical plasma enhanced atomic layer deposition (ALD) processes have the following steps in each cycle:

A dose of precursor gas

A pump or purge step clearing the precursor gas from the chamber, leaving adsorbed species on the substrate surface Exposure to gases excited by a plasma, which react with adsorbed species to create a solid thin film on the substrate Optionally a pumping or purging step to clear plasma-excited gases from the chamber.

It is an advantage if the cycle time is as short as possible. The plasma exposure time can be a significant fraction of the total cycle time, and needs to be minimised. Low pressure is used for the process, typically up to 1 mbar absolute pressure. Coupling power to the plasma must be reliable, even when most internal surfaces of the process chamber are coated at the same time as the substrate, and the deposited layer can be electrically conducting. Precursor gases used in many ALD processes are vapours which tend to condense easily unless all surfaces are heated, usually in the range 100 to 200 degrees C. The disclosed plasma generation apparatus 300 takes these considerations into account.

In the exemplary apparatus depicted in FIG. 1, the plasma generation gas source 105a is shown as delivering gas directly into the chamber 102 through a wall thereof, while gas source 105b is depicted as delivering a gas through the electrode array 200, but in practice either or both options may be employed for different gases. For example, the reactant gas(es) for the plasma processing step might be delivered through wall of the chamber (i.e. as per source 105a), whilst a delivery conduit through the electrode array 200 (i.e. as per source 105b) may be used to supply a purge gas between plasma processing steps, as will be discussed further below. There may also be multiple gas introduction points to the processing chamber for each gas source if desired. The supplies of precursor gas and gas for plasma generation from the sources 105a, 105b to the chamber 102 can be controlled using respective valves 106a, 106b. The valves are preferably tailored for injection of short gas pulses.

The plasma processing tool 101 is connected to a control unit 121, which may be commanded by a processor 122. The control unit 121 can control, for example, the RF power source 270, the signal generator 112, the valves 106a, 106b and the lift 113, in accordance with the processes to be performed on the substrate.

Figure 2:
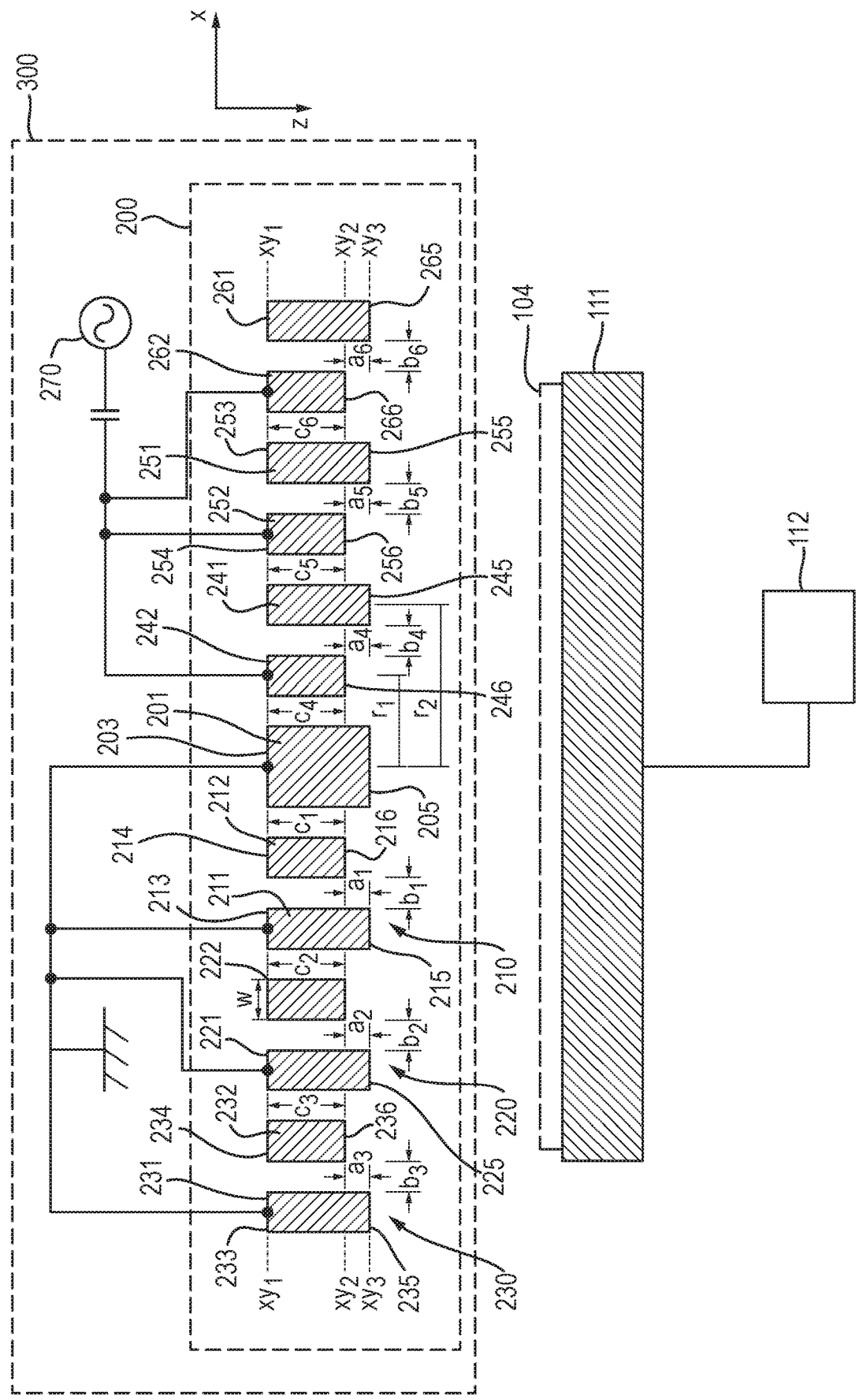
FIG. 2 schematically shows an embodiment of a plasma generation apparatus in accordance with the present invention, including an exemplary plasma generation electrode array in cross-section.

FIG. 2 shows schematically an embodiment of a plasma generation apparatus 300. The plasma generation apparatus 300 includes an electrode array 200 which here is shown in cross-section. Also shown to help illustrate the working of the plasma generation apparatus is an exemplary substrate table 111 and a substrate 104, arranged relative to the plasma generation apparatus 300 as will be the case in use. A first direction, which is substantially parallel to the substrate table 111, is indicated by the arrow X and a second direction, which is perpendicular to the first direction X, is indicated by the arrow Z.

In this embodiment, the electrode array 200 includes a plurality of ground electrodes 201, 211, 221, 231, 241, 251, 261, which are electrically grounded, and a plurality of live electrodes, 212, 222, 232, 242, 252, 262, which are electrically connected to an RF power source 270. The ground and live electrodes may be formed out of any electrically conductive material, but metals or metal alloys are preferred, particularly aluminium or aluminium alloys. In this example the live electrodes 212, 222, 232 are in electrical contact with the live electrodes 242, 252, 262 respectively. Hence, although only the connections between the live electrodes 242, 252, 262 and the RF power source 270 are shown, the live electrodes 212, 222, 232 are also in electrical contact with the RF power source 270. Similarly, while the only the connections to ground of the ground electrodes 211, 221, 231 are shown, the ground electrodes 241, 251, 261 are in electrical contact with the ground electrodes 211, 221, 231 respectively and are hence also grounded.

It will be seen that the use of a plurality of live and ground electrodes in the manner disclosed enables the electrode array to be configured such that it extends across any chosen area, through the number and position of electrodes chosen. Desirably, the electrode array is configured such that its lateral extent is at least equal to that of the substrate 104, or the substrate table 111, in the first direction X. This ensures that a uniform plasma flux can be delivered across the whole substrate 104 simultaneously, without the need for additional hardware between the plasma source and the substrate, thereby reducing the amount of time that the substrate need be exposed to the plasma to ensure that all parts of its surface have been treated. The proximity of the plasma source to the wafer also reduces the necessary exposure time, compared with a conventional remote plasma source.

The electrical contact between pairs of live electrodes (e.g. 212 and 242, 222 and 252, 232 and 262) and pairs of ground electrodes (e.g. 211 and 241, 221 and 251, 231 and 261) could be achieved by forming each pair of electrodes as parts of a respective electrode shaped as a loop or ring, e.g. an annular electrode, that lies in the plane perpendicular to the second direction Z. In such examples the central ground electrode 201 could have a cylindrical shape with its axis of symmetry aligned along the second direction Z. For example, the live electrodes 212, 242 could be different portions of a single annular live electrode that has a radius $r_1$ and is concentric with the axis of the ground electrode 201. Similarly, the ground electrodes 211, 241 could be different portions of a single annular ground electrode with a radius $r_2$ that is also concentric with the central ground electrode 201. Other shapes of electrode such as square, rectangular or elliptical loop electrodes could alternatively be used, but annular electrodes are preferred since these will provide the most uniform plasma in all directions.

The ground and live electrodes are alternately arranged along the first direction X. When the RF power source 270 powers the live electrodes 212, 222, 232, 242, 252, 262, a voltage is generated between each live electrode and the neighbouring ground electrodes. For example, there will be a voltage between the live electrode 212 and the ground electrodes 201 and 211 when the live electrodes 212, 222, 232, 242, 252, 262 are powered by the RF power source 270. The RF power source 270 is configured to generate a sufficient voltage between neighbouring live and ground electrodes to break down a gas for plasma generation (such as the examples listed above with reference to FIG. 1) into a plasma and achieve a steady, sustained rate of ionisation of the gas for plasma generation.

Each ground electrode 201, 211, 221, 231, 241, 251, 261 and each live electrode 212, 222, 232, 242, 252, 262 has a base and a distal end. For example, the ground electrode 251 has a base end 253 and a distal end 255, and the live electrode 252 has a base end 254 and a distal end 256. In this example, the bases 203, 213, 223, 233, 243, 253, 263 of the ground electrodes 201, 211, 221, 231, 241, 251, 261 and the bases 214, 224, 234, 244, 254, 264 of the live electrodes are aligned in the plane $XY_1$. This is an example of a notional first plane which is parallel to the substrate table 111 in use and perpendicular to the second direction Z. (All embodiments will have at least one such first plane which all of the ground and live electrodes intersect, but it will not necessarily be a plane in which all the base ends of the electrodes are positioned.)

The distal ends 205, 215, 225, 235, 245, 255, 265 of the ground electrodes 201, 211, 221, 231, 241, 251, 261 are further from the first plane $XY_1$ and hence closer to the substrate table 111 along the second direction Z than are the distal ends 216, 226, 236, 246, 256, 266 of the live electrodes 212, 222, 232, 242, 252, 262. This modifies the electric field distribution in such a way that a greater proportion of the electric field lines terminate on the ground electrodes, and fewer terminate at the substrate 104. As a result the most intense plasma will run in the lateral spaces between the live and ground electrodes. This in turn reduces the tendency of currents to arise between the live electrodes 212, 222, 232, 242, 252, 262 and the substrate table 111 (as compared with conventional arrangements in which the distal ends of the ground electrodes are not closer to the substrate table 111 than are the distal ends of the live electrodes), thereby reducing the likelihood of ions being generated near a substrate 104 on the substrate table 111 and hence mitigating the damage caused at the surface of the substrate 104 by ion bombardment.

Each ground electrode is neighboured by at least one live electrode. For example, live electrode 212 neighbours the ground electrode 211. The distal end 215 of the ground electrode 211 is closer to the substrate table 111 along the second direction Z than the distal end 216 of the live electrode 212 by a distance $a_1$. Similarly, the live electrode 232 and the ground electrode 231 neighbour one another and the distal end 235 of the ground electrode 231 is closer to the substrate table along the second direction Z than is the distal end 233 of the live electrode 232 by a distance $a_3$.

In this example, the distal ends 205, 215, 225, 235, 245, 255, 265 of each of the ground electrodes 201, 211, 221, 231, 241, 251, 261 are aligned in a plane $XY_3$ and the distal ends 216, 226, 236, 246, 256, 266 of the live electrodes 212, 222, 232, 242, 252, 262 are aligned in a plane $XY_2$. The planes $XY_2$ and $XY_3$ are perpendicular to the second direction Z. Hence, in the present embodiment the distal ends of all of the ground electrodes 201, 211, 221, 231, 241, 251, 261 are closer to the substrate table 111 along the second direction Z than are those of all the live electrodes 212, 222, 232, 242, 252, 262. However, this is not essential and in some embodiments the bases and distal ends of the electrodes may not be so uniformly aligned as in this example: what is important is that the distal end of each ground electrode is closer to the substrate table 111 along the second direction Z than the distal end of a neighbouring live electrode (preferably all its neighbouring live electrodes, if there is more than one).

A pair of neighbouring ground electrodes includes a ground electrode (i) and a neighbouring (i.e. immediately adjacent) live electrode (j). In general terms, the distance in the Z direction between the distal end of the live electrode and that of the ground electrode is can be referred to as $a_{ij}$ where i is the ground electrode of the pair in question and j is the live electrode of the pair. For example, ground electrode 211 and the live electrode 212 constitute a pair of neighbouring ground and live electrodes 210. The distal end 215 of the ground electrode 211 is positioned a distance $a_1$ closer to the substrate table 111 along the second direction Z than is the distal end 216 of the live electrode 212.

It has been found particularly advantageous if each pair of neighbouring ground and live electrodes 210, 220, 230, 240, 250, 260 is arranged such that its ground electrode (i) and its live electrode (j) are separated by a distance $b_{ij}$ along the first direction X that is no greater than three times the distance $a_{ij}$ by which the distal end of the ground electrode is closer along the second direction Z to the substrate table 111 than is the distal end of the live electrode. For example, in the pair of neighbouring electrodes 210, the ground electrode 211 and the live electrode 212 are separated by a distance $b_1$ along the first direction, and $b_1$ is equal to twice the distance $a_1$ by which the distal end 215 of the ground electrode 211 is closer along the second direction Z to the substrate table 111 than is the distal end 216 of the live electrode 212.

In this example, each pair of neighbouring ground and live electrodes 210, 220, 230, 240, 250, 260 is arranged such that the distal end of the ground electrode is positioned closer to the substrate table 111 along the second direction Z than is the distal end of the live electrode by the same distance. That is to say that the distances $a_1$, $a_2$, $a_3$, $a_4$, $a_5$ and $a_6$ are all equal to one another. Similarly, the ground electrode and the live electrode in each pair of neighbouring ground and live electrodes 210, 220, 230, 240, 250, 260 are separated by the same distance along the first direction X. That is to say that, in this example, the distances $b_1$, $b_2$, $b_3$, $b_4$, $b_5$ and $b_6$ are all equal to one another. As a result, distance $b_1$ is twice the distance $a_1$, distance $b_2$ is twice the distance $a_2$, and so on. In other embodiments, however, these dimensions could take any combination of different values provided that each pair of neighbouring ground and live electrodes is arranged so as to satisfy the requirement that the distal end of the ground electrode (i) is closer along the second direction Z to the substrate table 111 than is the distal end of the neighbouring live electrode (j) (preferably by a distance $a_{ij}$ that is at least one third, preferably at least half, of the separation $b_{ij}$ of the ground electrode and the neighbouring live electrode along the first direction X).

Each live electrode 212, 222, 232, 242, 252, 262 has a respective length $c_1$, $c_2$, $c_3$, $c_4$, $c_5$, $c_6$ between its base and distal end along the second direction Z. The majority of the plasma that is generated as a result of the live electrodes 212, 222, 232, 242, 252, 262 being powered is formed in the spaces between the live electrodes 212, 222, 232, 242, 252, 262 and the ground electrodes 201, 211, 221, 231, 241, 251, 261, i.e. in the spaces bounded by the dimensions $b_1$, $b_2$, $b_3$, $b_4$, $b_5$, $b_6$ and $c_1$, $c_2$, $c_3$, $c_4$, $c_5$, $c_6$ respectively. These spaces can be referred to as "intense plasma regions". For example, the intense plasma region between the ground electrode 211 and the live electrode 212 has a width $b_1$ along the first direction X and a length $c_1$ along the second direction Z. In general, as a gap $b_{ij}$ between a ground electrode (i) and a neighbouring live electrode (j) is made smaller in relation to the length $c_j$ of the respective live electrode, a greater fraction of the ions generated in the intense plasma region bounded by the dimensions $b_{ij}$ and $c_j$ is quenched before said ions escape the space. However, this also increases the tendency of radicals to be eliminated by collisions with the ground and live electrodes before diffusing out of the intense plasma region. It has been found that, for a given pair of neighbouring ground and live electrodes, the flux of ions escaping to the substrate table is reduced by a particularly preferred fraction when $c_j$ is at least 1.5 $b_{ij}$, and a particularly preferred flux of radicals is achieved while $c_j$ is no more than four times $b_{ij}$. The electrode array 200 is thus preferably arranged such that $c_1$ is between 1.5 and four times $b_1$, $c_2$ is between 1.5 and four times $b_2$, and so on.

In this example, each of the live electrodes 212, 222, 232, 242, 252, 262 has the same length as the others. That is to say that the dimensions $c_1$, $c_2$, $c_3$, $c_4$, $c_5$, $c_6$ are all equal to one another. As previously stated, the separations $b_1$, $b_2$, $b_3$, $b_4$, $b_5$ $b_6$ of neighbouring ground and live electrodes are also equal to one another. Thus, in this example, in each pair of neighbouring ground and live electrodes 210, 220, 230, 240, 250, 260 the ratio of the separation $b_{ij}$ of the ground electrode (i) and the live electrode (j) along the first direction X and the length $c_1$ of the live electrode along the second direction Z is the same (and is such that $c_1$ is between two and four times $b_{ij}$). In this example specifically, the dimensions $b_1$, $b_2$, $b_3$, $b_4$, $b_5$ $b_6$ each have a magnitude of approximately 15 mm, and the lengths $c_1$, $c_2$, $c_3$, $c_4$, $c_5$, $c_6$ each have a magnitude of approximately 30 mm. Each pair of neighbouring live and ground electrodes 210, 220, 230, 240, 250, 260 therefore has an intense plasma region in which $c_{ij}$ is approximately 2 times $b_{ij}$. In other examples, however, the individual dimensions $b_1$, $b_2$, $b_3$, $b_4$, $b_5$ $b_6$ and $c_1$, $c_2$, $c_3$, $c_4$, $c_5$, $c_6$ can span a range of different values while still allowing each pair of neighbouring ground and live electrodes 210, 220, 230, 240, 250, 260 to be arranged such that, for each pair of neighbouring ground and live electrodes, $c_1$ is between 1.5 and four times $b_{ij}$.

In this example each live electrode has a width w along the first direction X of approximately 16 mm. More generally it is preferable that the width w is less than 1.1 times the separation $b_{ij}$ between the live electrode (i) and a neighbouring ground electrode (j). In addition to the features discussed above, this further reduces the tendency of discharge currents to developing between the live electrodes 212, 222, 232, 242, 252, 262 and the substrate table 111. Whilst in the present example, all the live electrodes have the same width w as one another, this is not essential.

It should also be noted that whilst in this embodiment the electrode array 200 includes a plurality of live electrodes, as is preferred in order that the source can generate a homogenous plasma over a wide area, this is not essential. At the minimum, the electrode array 200 could comprise a single live electrode and two ground electrodes (one on either side of the live electrode), thus forming two neighbouring pairs. All the above-discussed considerations as to the geometry of the electrodes still apply.

Optionally but preferably, the substrate table 111 is connected to a second RF power source 112. This can be used to electrically bias the substrate table and thereby modify the ion flux to the substrate still further. For example, waveforms can be applied to the table which are tailored to control the ion energy distribution. This can be utilised to modify the substrate surface by ion bombardment or, by changing the waveform accordingly, to control the distribution of ion energy impacting the substrate. For instance, controlled ion bombardment of this sort may be appropriate during certain deposition processes to modify the film properties, and/or may be employed during etching steps.

Figure 3:
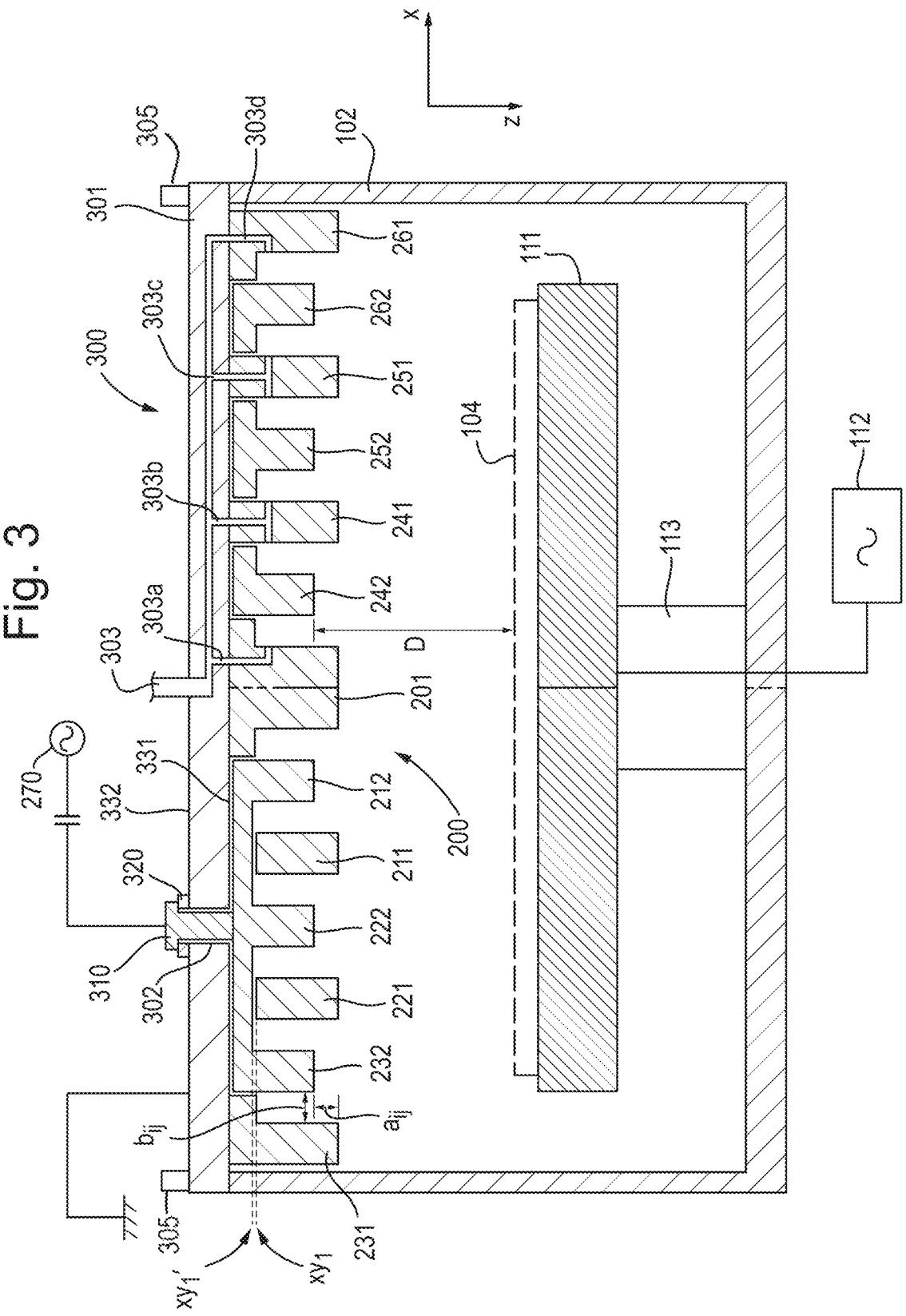
FIG. 3 shows a cross-section of an embodiment of a plasma processing tool including an embodiment of a plasma generation apparatus in accordance with the present invention.

FIG. 3 shows a cross-sectional view of another embodiment of a plasma generation apparatus 300 and a processing chamber 102 which may be used in the plasma processing tool 101 shown in FIG. 1. The arrangement of the electrode array 200, and particularly the relative configuration of the ground and live electrodes, is substantively the same as already described with reference to FIG. 2 and hence will not be described here again. In this case, however, the bases of the ground and live electrodes are not coplanar: rather the bases of the ground electrodes 201, 211, 211 ... lie in plane $XY_1$ whilst the bases of the live electrodes 212, 222, 232 ... lie in plane $XY_1'$, which is parallel to but spaced from plane $XY_1$ to ensure electrical separation.

The substrate table 111 is situated inside the chamber 102 and is supported by the lift 113, which can be controlled so as to adjust the position of the substrate table 111 along the second direction Z. Although the position of the substrate table 111 along the second direction Z can be varied using the lift 113, the substrate table 111 is always positioned a distance D from the distal ends of the live electrodes 212, 222, 232, 242, 252, 262 along the second direction Z that is greater than the separation $b_{ij}$ along the first direction X between neighbouring live and ground electrodes. This further reduces the likelihood of a current arising between the live electrodes 212, 222, 232, 242, 252, 262 and the substrate table 111.

The electrode array 200 of the plasma generation apparatus 300 comprises a panel 301 that forms an upper wall of the chamber 102. The ground electrodes 201, 211, 221, 231, 241, 251, 261 are integrally connected to, and in electrical contact with, the panel 301. The ground electrodes 201, 211, 221, 231, 241, 251, 261 are each portions of a single integrally formed electrically conductive unit, which lies in the plane perpendicular to the second direction Z. Similarly, the live electrodes 212, 222, 232, 242, 252, 262 are also portions of a single electrically conductive unit which has an annular shape and lies in the plane perpendicular to the second direction Z. A bore 302 extends through the panel 301 along the second direction Z between a first surface 331 of the panel 301 and a second surface 332 of the panel 301.

The panel 301 is electrically grounded, so the ground electrodes 201, 211, 221, 231, 241, 251, 261 are thus also electrically grounded as a result of being in electrical contact with the panel 301. The live electrodes 212, 222, 232, 242, 252, 262 are supported by, but electrically isolated from, the panel 301. An electrically conductive feedthrough 310 extends through the bore 302 in the panel 301 and is in electrical contact with the live electrodes 212, 222, 232, 242, 252, 262. The feedthrough 310 is also electrically connected to the RF power source 270, so the live electrodes 212, 222, 232, 242, 252, 262 are in electrical contact with the RF power source 270 via the feedthrough 310. The feedthrough 310 and the bore 302 will be described in detail below with reference to FIG. 4. In practice, more than one such feedthrough 310 and corresponding bore 302 may be provided, to provide multiple connections to the live electrodes through the panel.

A conduit 303 is formed in the plasma generation electrode array 200. The conduit 303 extends through the panel 301 and has a plurality of branches 303a, 303b, 303c, 303d which extend through, and open onto the sides of, the ground electrodes 201, 241, 251 and 261 respectively. The conduit 303 may be connected to, for example, a source of gas for plasma generation, a precursor gas source or a purge gas source (such as the gas source 105b shown in FIG. 1) so as to allow a gas to be delivered to the intense plasma regions between the electrodes in the electrode array 200.

The electrode array 200 is preferably at least as wide in the first direction X as is the substrate table 111. This helps to ensure that, when the plasma generation apparatus 300 is in use generating a plasma, a uniform flux of radicals is received across the full extent of the substrate table 111. Moreover, this reduces the amount of time that the substrate need be exposed to the plasma, since the whole surface of the substrate will receive substantially the same maximum plasma flux simultaneously. The necessary exposure time is also reduced, relative to that required with remote ICP sources, by the proximity of the electrode array to the substrate.

The panel 301 can be heated on its second side 332 by an external heat source 305. The panel 301 is formed so as to effectively transmit heat from its second side 332 to the ground electrodes 201, 211, 221, 231, 241, 251, 261, with which it is integrally formed, so the ground electrodes 201, 211, 221, 231, 241, 251, 261 will also be heated when the second side 332 of the panel 301 is heated. Each of the live electrodes 212, 222, 232, 242, 252, 262 contains a resistive element (see item 222a in FIG. 4) that can be electrically powered so as to heat the live electrodes 212, 222, 232, 242, 252, 262. Heating the ground electrodes 201, 211, 221, 231, 241, 251, 261 and the live electrodes 212, 222, 232, 242, 252, 262 reduces the rate at which material will be deposited on the electrode array 200 by a plasma, thereby reducing the frequency with which the plasma generation apparatus 300 requires cleaning and/or maintenance. The components may typically be heated to a temperature in the range 100 to 200 degrees C., to reduce condensation of material on their surfaces.

Figure 4:
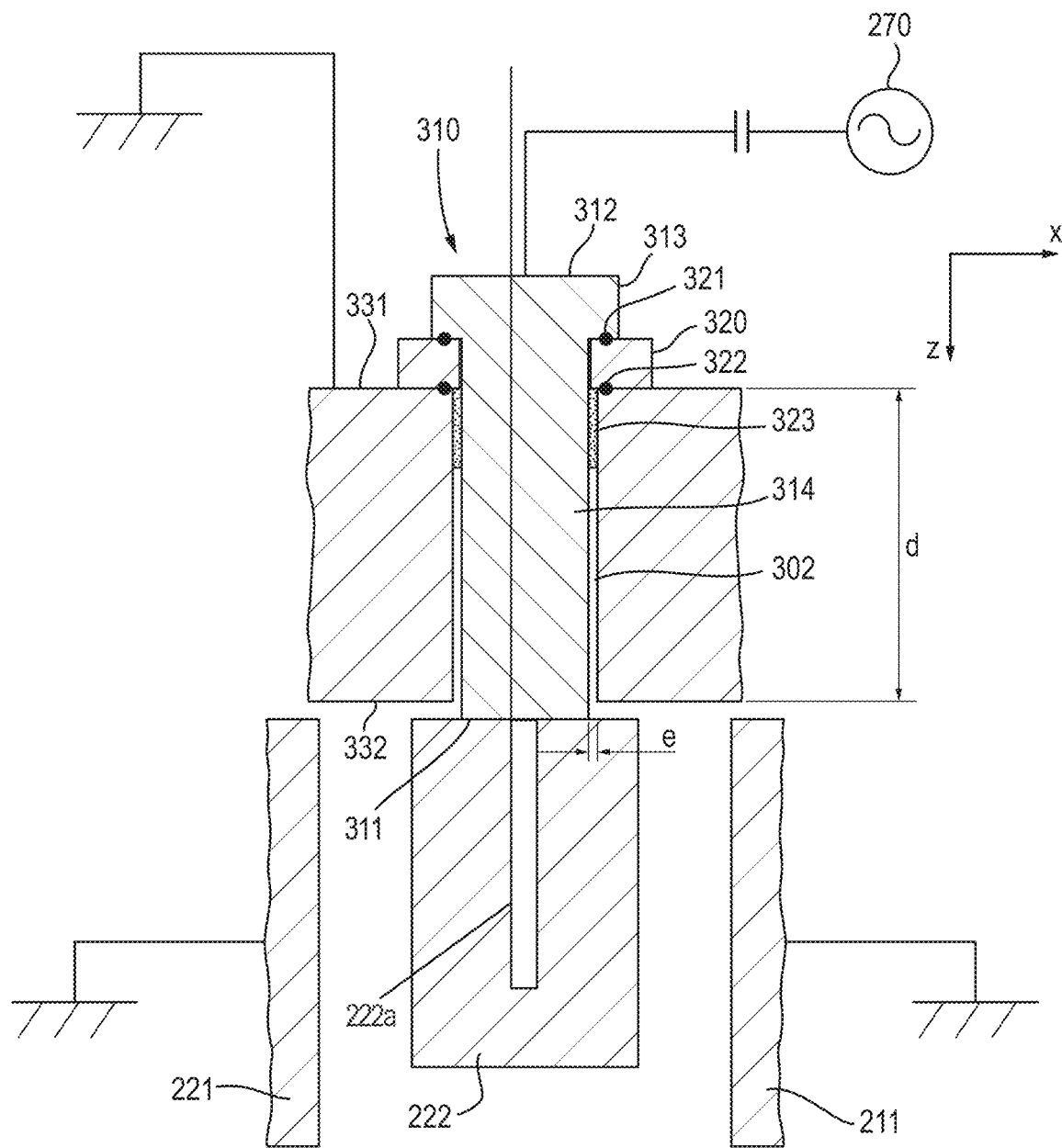
FIG. 4 shows an enlarged detail of a portion of the plasma generation apparatus of FIG. 3.

FIG. 4 shows an enlarged detail, in cross section, of a portion of the plasma generation apparatus 300 shown in FIG. 3, including the bore 302 formed in the panel 301 and the feedthrough 310 that extends through the bore 302. As noted above multiple such feedthroughs and bores may be present in practice. The feedthrough 310 has a first end 311 that is in contact with the live electrode 222, a shaft 314 that extends through the bore 302 and a second end 312 which is shaped so as to include a flange 313 that is wider in the first direction X than is the bore 302. An electrically insulating element 320 substantially surrounds a portion of the shaft between the flange 313 and the second surface 332 of the panel 301, thereby preventing the feedthrough 310 and the panel 301 from coming into electrical contact with one another. The electrically insulating element 320 can be formed of any suitable electrically insulating material, but preferably is formed of a dielectric material such as PTFE (polytetrafluoroethylene), PEEK (polyether ether ketone) or ceramics such as alumina. A first O-ring 321 surrounds a portion of the shaft 314 of the feedthrough between the flange 313 and the electrically insulating element 320, and a second O-ring 322 surrounds a portion of the shaft 314 between the insulating element 320 and the second surface 322 of the panel 301. The O-rings 321, 322 are configured to seal the opening of the bore 302 on the second surface 331 of the panel 301 so as to allow the conditions required for plasma processing, e.g. a partial vacuum, to be sustained inside the chamber 102.

The electrically insulating element 320 may have an extended portion 323 which extends into the bore 302 and substantially surrounds a portion of the shaft 314 inside the bore 302. The extended portion 323 prevents plasma generated by the plasma generation apparatus 300 from entering the region of the bore 302 in which the extended portion 323 is situated, thereby preventing material being deposited on the surfaces of the feedthrough 310 and the bore 302 in that region by the plasma. Preferably the extended portion 323 fills at least half of the space remaining between the feedthrough shaft 314 and the walls of the bore 302. In this example the extended portion 323 of the electrically insulating element 320 is an integral part of the electrically insulating element 323, but in other embodiments the extended portion 323 could be substituted by a separate second electrically insulating element to achieve substantially the same effect.

The bore 302 has a length d along the second direction Z, and there is a gap of a width e between the shaft 314 inside the bore and the inner surface of the bore 302. The feedthrough 310 and the bore 302 are formed such that the length d of the bore is at least 10 times the width e of the gap between the feedthrough 310 and the inner surface of the bore 302. This discourages plasma from travelling along the space between the feedthrough 310 and the inner surface of the bore 302. This effect is further enhanced if the length d of the bore is greater than 50 times the width e of the gap. In this example the width e can be between 0.5 mm and 2.5 mm. The preferred design, shown more fully in FIG. 3, additionally removes all line of sight between the bore and the intense plasma regions, as a result of the convoluted path formed by the electrode plates closely interlocking with each other. This further assists in preventing plasma ingress into the bore region. The distance e determines whether or not a plasma will strike at a given gas pressure. Gaps with widths in the range 0.5 mm to 2.5 mm will suppress plasma in the narrow coaxial space within the bore 302 at pressures lower than about 5 Torr (although the plasma will run elsewhere at such pressures). With such dimensions, if the chamber pressure were above about 5 Torr, a plasma might be generated in the bore gap which would be undesirable. As such, the maximum preferred chamber pressure may be limited accordingly to avoid this.

Figure 5A:
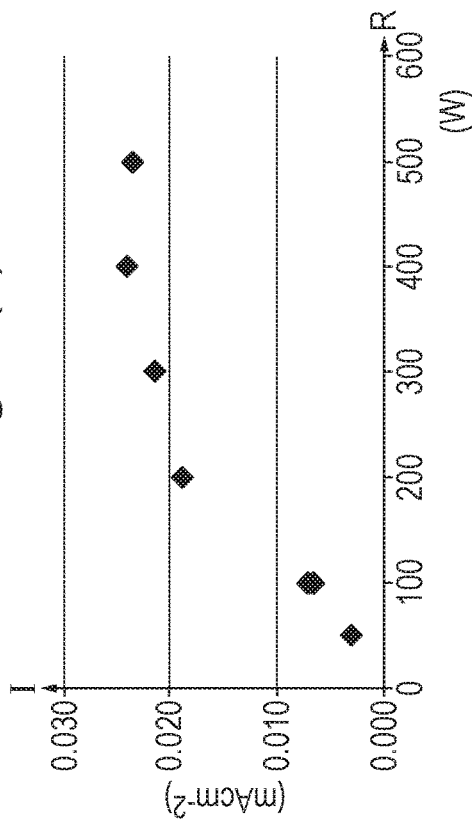
FIGS. 5 (a) to (d) are graphs showing the results of tests performed using a the plasma processing tool of the sort shown in FIG. 3.
Figure 5B:
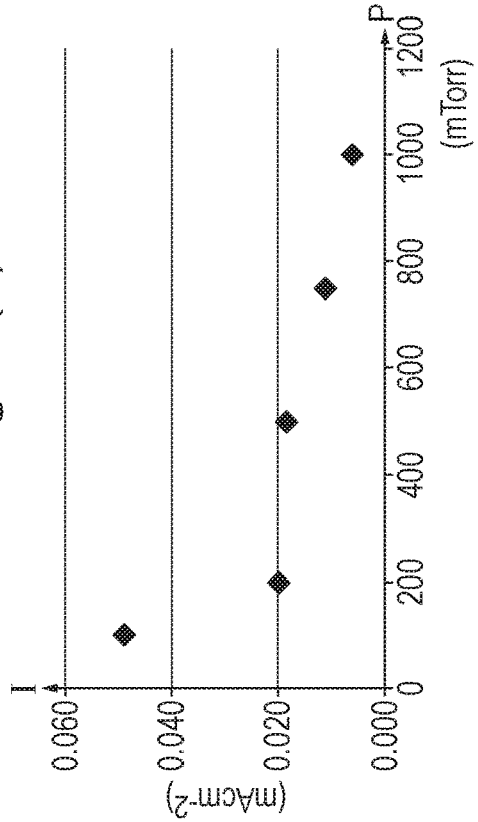
Figure 5C:
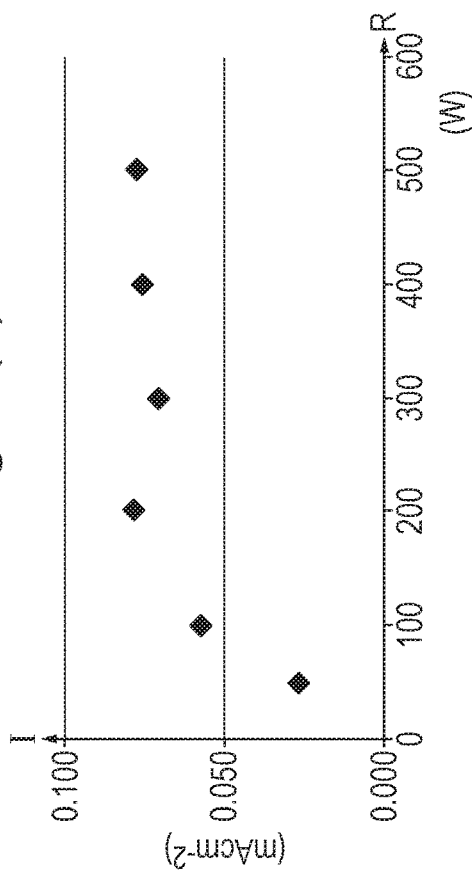
Figure 5D:
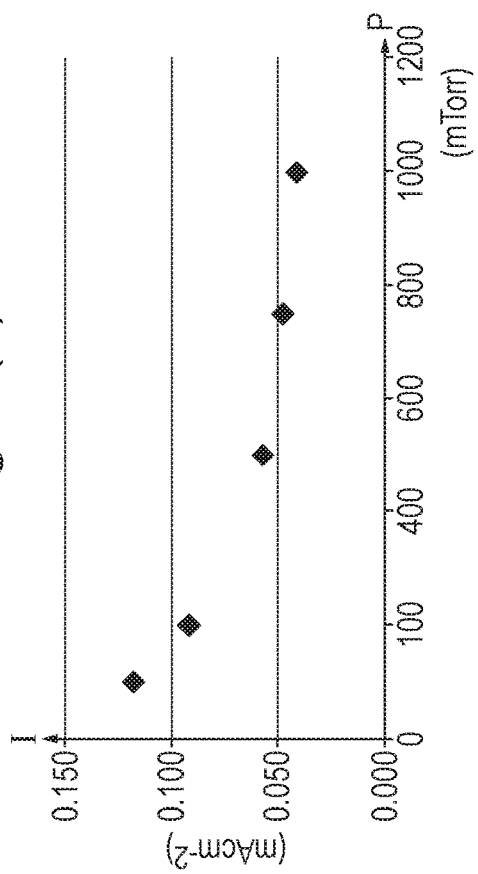

To illustrate the effectiveness of the disclosed electrode array, tests were performed using a plasma processing tool of the sort described above in relation to FIGS. 3 and 4. In the practical example used, there were two live electrode rings and two ground electrode rings (rather than three of each type, as shown in FIG. 3), plus a central ground electrode. The distal ends of the ground electrodes extended 6.5 to 8.5 mm beyond those of the live electrodes. The electrode spacing and live electrode lengths and widths were as given above in the FIG. 3 example. The bore gap at the feedthrough was 1.5 mm, and the ratio of feedthrough dimensions d:e was approximately 50. First, the ion flux to the substrate table 111 was measured for an atmosphere of argon across a range of plasma source power levels R applied by the RF power source 270 to strike the plasma, and across a range of gas pressures P. This was carried out by using a Langmuir probe to measure the ion current density at the substrate table. The results are shown in FIGS. 5(a) and (b) respectively, which show: (a) Ion current density, I, vs. RF power, R, at an argon pressure of 0.5 Torr; and (b) Ion current density, I, vs. argon pressure, P, at an RF power of 200 W. The ion current density measurements are shown in units of mA cm$^{-2}$. Second, the same tests were repeated for an atmosphere of oxygen. The results are shown in FIGS. 5(c) and (b), which show: (a) Ion current density, I, vs. RF power, R, at an oxygen pressure of 0.5 Torr; and (b) Ion current density, I, vs. oxygen pressure, P, at an RF power of 200 W. The ion current density measurements are again shown in units of mA cm$^{-2}$. It will be seen that across all conditions in the pressure range 0.1-1 Torr and up to 600 W source power, the ion flux at the wafer was below 0.2 mA cm$^{-2}$ in argon and below 0.1 mA cm$^{-2}$ in oxygen. For comparison, in a conventional parallel plate plasma chamber of similar dimensions, the ion current density at the wafer would typically be greater than 1 mA cm$^{-2}$ under similar conditions.

To confirm the generation of sufficient radicals, the same plasma processing tool was then used in a process for oxygen etching a thin film of polymethyl methacrylate (PMMA). The etch rate will be indicative of the flux of atomic oxygen radicals. At a source power (R) of 100 W, pressure 100 mTorr, flow 100 sccm oxygen in a three minute etch test, an etch rate of 20 nm/minute was measured. This is below the 70 to 90 nm/minute etch rate measured under identical conditions in a standard plasma etch chamber, where the etch rate is enhanced by ion bombardment, but indicates a significant flux of radicals to the wafer surface.

In further tests, the disclosed plasma processing tool has achieved the following deposition rates for thin films deposited using plasma enhanced atomic layer deposition (compared to lower rates achieved formerly with a conventional remote ICP plasma source):

$Al_2O_3$: 8.3 nm/minute (1.5 nm/minute formerly)
TiN: 1.5 nm/min (0.1 nm/min formerly)

The improvement in rate is attributed substantially to the reduction in cycle time. The uniformity achieved on a 200 mm diameter substrate for each of these processes was better than +/−2%, demonstrating the uniformity of the large area plasma source.

The invention claimed is:

1. A plasma processing tool, comprising:
a processing chamber;
a substrate table situated inside the processing chamber for supporting a substrate in use on which material is to be deposited and/or etched;
at least one gas supply configured to deliver, in use, a gas for plasma generation to the processing chamber;
a plasma generation electrode array comprising a plurality of ground electrodes and at least one live electrode, the plurality of ground electrodes not being in electrical contact with the at least one live electrode, and arranged such the ground electrodes and live electrode(s) alternate with one another along a first direction in a first plane which is substantially parallel to the substrate table in use, the ground and live electrodes being spaced from one another along the first direction, wherein each of the ground and live electrodes extends from a base thereof to a distal end thereof in a second direction which is substantially perpendicular to the first plane, the ground electrodes and the at least one live electrode being arranged such that the distal ends of the ground electrodes are positioned further along the second direction than the distal end(s) of the at least one live electrode(s) such that, in use, the distal ends of the ground electrodes are closer, in the second direction, to the substrate table than are the distal end(s) of the at least one live electrode(s);
wherein the plasma generating electrode array is situated such that at least the ground and live electrodes thereof are inside the processing chamber; and
an electrical power source connected to the at least one live electrode;
wherein each ground electrode (i) is separated from the adjacent live electrode (j) along the first direction by a respective distance $B_{ij}$, and the distance along the second direction between the distal end of each ground electrode (i) and the substrate table is greater than the respective distance $B_{ij}$.

2. The plasma processing tool of claim 1, wherein:
the distal end of each ground electrode (i) is positioned further along the second direction than the distal end of an adjacent live electrode (j) by a distance $A_{ij}$;
wherein $A_{ij}$ is greater than or equal to $B_{ij}/3$, preferably $A_{ij}$ is greater than or equal to $B_{ij}/2$.

3. The plasma processing tool of claim 2, wherein distance $B_{ij}$ is substantially the same for each pair of adjacent ground and live electrodes, and wherein distance $A_{ij}$ is preferably also substantially the same for each pair of adjacent ground and live electrodes.

4. The plasma processing tool of claim 1, wherein:
the distance along the second direction between the base and the respective distal end of each live electrode (j) is $C_j$;
wherein $C_j$ is greater than or equal to $1.5B_{ij}$, preferably also $C_j$ is less than or equal to $4B_{ij}$.

5. The plasma processing tool of claim 1, wherein the width along the first direction of each of the at least one live electrode is less than 1.1 times the separation along the first direction between said live electrode and a respective adjacent ground electrode.

6. The plasma processing tool of claim 1, wherein the length of each ground electrode from the base thereof to the distal end thereof is greater than the length of the or each live electrode from the base thereof to the distal end thereof.

7. The plasma processing tool of claim 1, wherein the cross-section of each of the ground electrodes and/or the at least one live electrode in the first plane is a closed loop, preferably annular.

8. The plasma processing tool of claim 1, further comprising a panel adapted, in use, to form all or part of a wall of a processing chamber in a plasma processing tool, the panel having a first side on which the ground electrodes and the at least one live electrode are supported, the ground electrodes being in electrical contact with the panel and the at least one live electrode being out of electrical contact with the panel;
wherein a bore extends from the first side of the panel to a second side of the panel whereby the at least one live electrode may be accessed from the second side of the panel.

9. The plasma processing tool of claim 8, further comprising:
a feedthrough which extends through the bore, the feedthrough being out of electrical contact with the panel and in electrical contact with the at least one live electrode.

10. The plasma processing tool of claim 9, wherein the feedthrough comprises:
a first end in contact with the at least one live electrode at the first side of the panel; and
an electrically conductive shaft extending through the bore from the first end to a second end on the second side of the panel.

11. The plasma processing tool of claim 10, wherein the second end of the feedthrough comprises a flanged portion having a greater width than the bore where the bore opens on the second side of the panel;
and further comprising a first electrically insulating element positioned between the flanged portion of the second end of the feedthrough and a portion of the surface of the second side of the panel;
wherein the first electrically insulating element preferably comprises a dielectric material.

12. The plasma processing tool of claim 9, further comprising a second electrically insulating element substantially surrounding a portion of the feedthrough inside the bore, wherein the second electrically insulating element preferably comprises a dielectric material.

13. The plasma processing tool of claim 9, wherein:
an outer surface of the feedthrough is separated from an inner surface of the bore by a distance E in the first direction; and
the bore extends a distance D along the second direction;
wherein D is greater than or equal to 10E, preferably D is greater than or equal to 50E.

14. The plasma processing tool of claim 8, wherein the ground electrodes are integrally connected to the panel.

15. The plasma processing tool of claim 14, further comprising a first heating element configured to heat the panel so as to cause the ground electrodes to be heated.

16. The plasma processing tool of claim 1, further comprising at least one second heating element adapted to heat the at least one live electrode.

17. The plasma processing tool of claim 1, further comprising a conduit adapted to deliver, in use, a gas to at least one interstice between a ground electrode and a live electrode, wherein the gas preferably comprises one of a purge gas and a gas for plasma generation.

* * * * *